United States Patent [19]
Matsuyama et al.

[11] Patent Number: 5,259,891
[45] Date of Patent: Nov. 9, 1993

[54] INTEGRATED TYPE SOLAR BATTERY

[75] Inventors: Jinsho Matsuyama; Tsutomu Murakami; Koichi Matsuda, all of Nagahama, Japan

[73] Assignee: Canon Kabushiki Kaisha, Tokyo, Japan

[21] Appl. No.: 844,749

[22] Filed: Mar. 2, 1992

[30] Foreign Application Priority Data

Mar. 4, 1991 [JP] Japan .................................. 3-61028

[51] Int. Cl.$^5$ .......................................... H01L 31/05
[52] U.S. Cl. .................................... 136/244; 136/249
[58] Field of Search ...................... 136/244, 249 MS

[56] References Cited

U.S. PATENT DOCUMENTS

| 4,281,208 | 7/1981 | Kuwano et al. | 136/249 |
| 4,313,022 | 1/1982 | Jordan et al. | 136/244 |
| 4,754,544 | 7/1988 | Hanak | 437/2 |
| 4,758,526 | 7/1988 | Thalheimer | 437/2 |
| 4,789,641 | 12/1988 | Inuzuka | 437/4 |

FOREIGN PATENT DOCUMENTS

| 60-77471 | 5/1985 | Japan | 136/244 |
| 62-5353 | 2/1987 | Japan | 136/244 |
| 62-113483 | 5/1987 | Japan | 136/244 |
| 62-203386 | 9/1987 | Japan | 136/244 |
| 1-206671 | 8/1989 | Japan | 136/256 |

Primary Examiner—Aaron Weisstuch
Attorney, Agent, or Firm—Fitzpatrick, Cella, Harper & Scinto

[57] ABSTRACT

An integrated type solar battery comprises a plurality of solar batteries serially connected. An upper electrode of one of a pair of adjacent solar batteries and a lower electrode of the other solar battery are connected via a lead wire. A groove of the boundary of the adjacent solar batteries is filled with an insulative material to a thickness sufficient to cover edge portions of the adjacent solar batteries. A conductive material is arranged so as to connect an upper portion of the insulative material and the upper electrode of one of the adjacent solar batteries. The lead wire is arranged over the insulative material along the groove portion of the boundary of the adjacent solar batteries so as to be connected to the conductive material. The lead wire is connected to the lower electrode of the other solar battery.

12 Claims, 7 Drawing Sheets

INTEGRATED TYPE SOLAR BATTERY

BACKGROUND OF THE INVENTION

1. Field of the Invention

The invention relates to a solar battery which is used in various power sources and, more particularly, to an integrated type solar battery in which a plurality of solar batteries are serially connected. The invention further relates to an integrated type solar battery using a thin film semiconductor.

2. Related Background Art

Generally, in the case of using a solar battery as a power source, a practical output voltage is not obtained when only a single solar battery element is used. Therefore, a plurality of solar battery elements are serially connected together. The serial connection of solar battery elements is a common feature irrespective of the kind of semiconductor material of the solar battery.

For instance, in a prior art solar battery using monocrystalline or polycrystalline silicon as a semiconductor layer, as shown in FIG. 6, adjacent solar batteries 601 and 602 are serially connected by connecting a collecting electrode 603 of one of the solar batteries 601 and the back surface of a wafer of the other solar battery 602 by lead wires 604. According to the above method, however, there is a problem in that electrical output is lost by the shadowing of the lead wires 604 which are connected to the collecting electrode 603. Also, since the lead wires are connected to the back surface of the wafer and the front and back surfaces of the wafer are coated with a resin, there are also problems such that the assembling steps are complicated and the manufacturing costs are high.

As a solar battery using a conductive substrate and an amorphous material as a semiconductor layer, there is known a solar battery in which a plurality of solar batteries are serially connected by using lead wires 705 as shown in FIG. 7. For example, a collecting electrode 703 of one (e.g., 701) of adjacent solar batteries 701 and 702 is connected to an edge portion 707 of the substrate of the other solar battery (e.g., 702) by the lead wires 705. In this case, however, there is also a problem in that electrical output is lost by the shadowing of the lead wires 705. There is also concern that edge portions 708 and 709 of the conductive substrate are short-circuited or the substrate edge portions 708 and 709 and the lead wires 705 are short circuited.

On the other hand, in a solar battery formed on an insulative substrate made of glass or the like by using an amorphous semiconductor material, there is known a method of serially connecting a plurality of solar batteries on an integrated substrate without using any lead wire.

As shown in FIG. 8, there is illustrated a solar battery wherein boundary portions of solar battery elements which are obtained by dividing a solar battery into a plurality of portions on a common substrate 801, an upper electrode 804 of one of the solar battery elements is connected to a lower electrode 805 of the adjacent solar battery element, thereby serially connecting the solar battery elements. According to this method, electric power is not lost by the shadows of lead wires. By optimizing the width of the solar battery elements between the connecting portions, electric power loss due to the resistance of transparent electrodes 802 and 805 and reduction of the light receiving area by the connecting portions can be decreased. According to the above method, however, since the lower electrodes 802 and 805, etc, semiconductor layers 803 and 806, etc, and upper electrodes 804 and 807, etc. must be individually patterned, there are problems such that the number of steps is large and the manufacturing costs rise. On the other hand, by increasing the light receiving area by narrowing the width of the connecting portion, the line width of patterning is narrowed. Therefore, there are problems such that the positioning accuracy of the patterning must be increased and the manufacturing apparatus becomes expensive. Further, according to the patterning method, there are problems such that the insulation of the connecting portion is insufficient and leakage current easily occurs. The above method is disclosed, for example, in JP-B-62-5353.

SUMMARY OF THE INVENTION

It is an object of the present invention to provide an integrated type solar battery in which a plurality of solar batteries are serially connected and an upper electrode of one of a pair of adjacent solar batteries is connected to a lower electrode of the other solar battery by a lead wire, wherein a groove portion of a boundary of the adjacent solar batteries is filled with an insulative material so as to cover the edge portions of the adjacent solar batteries, a conductive material is arranged so as to connect the upper portion of the insulative material and the upper electrode of one of the adjacent solar batteries, the lead wire is arranged on the insulative material along the groove portion of the boundary of the adjacent solar batteries so as to be connected to the conductive material, and the lead wire is connected to the lower electrode of the other solar battery, whereby loss of electric power by the shadows of the lead wires does not occur, fear of short-circuits is very small, disconnection of the conductive material can prevented, and the integrated type solar battery can be manufactured at low cost.

DETAILED DESCRIPTION OF THE PREFERRED EMBODIMENTS

Figure 1:
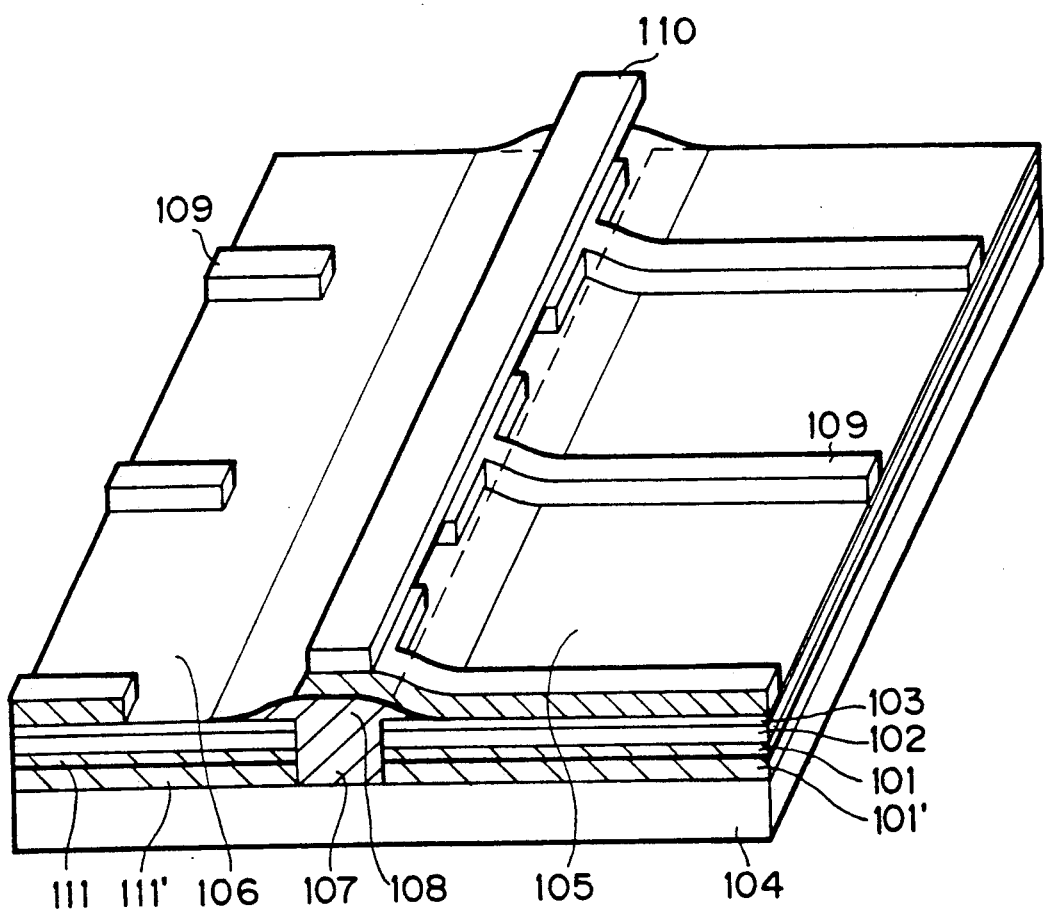
FIG. 1 is an explanatory diagram showing an example of an integrated type solar battery according to the invention and corresponds to an enlarged diagram of the portion surrounded by a broken line in FIG. 2.
Figure 2:
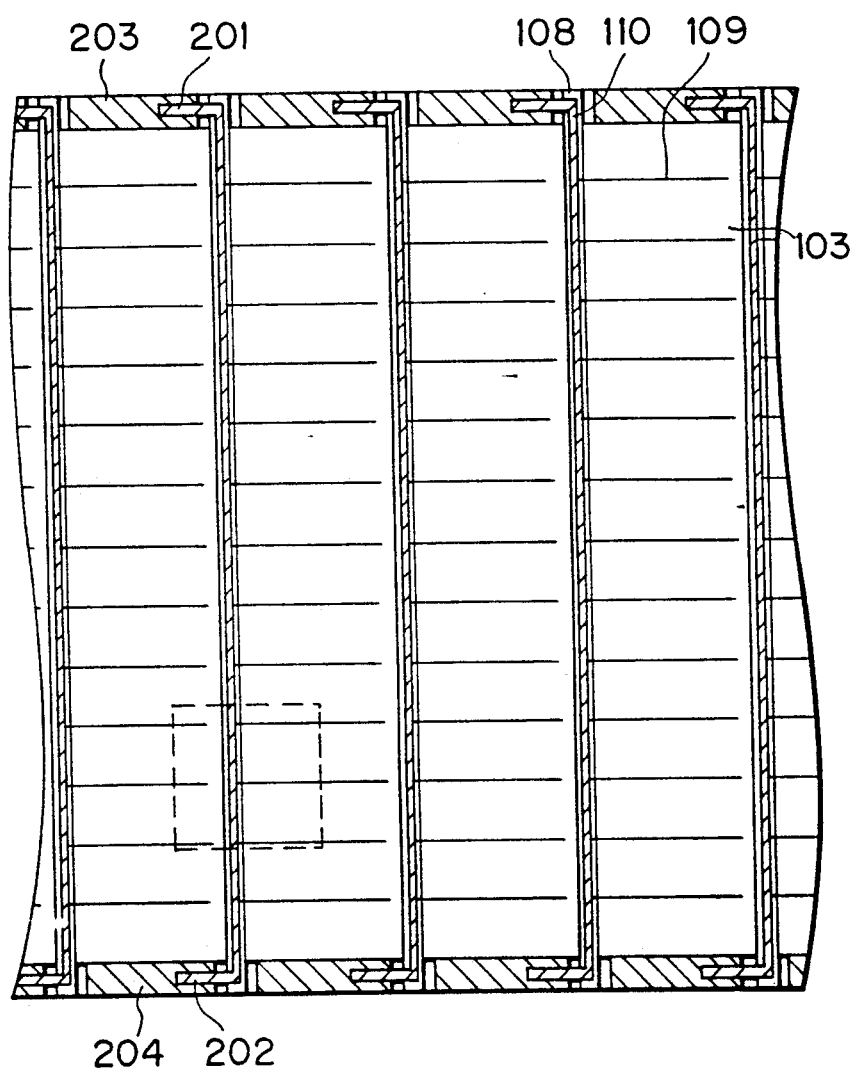
FIG. 2 is an external view of an example of the integrated type solar battery according to the invention.

A construction of an integrated type solar battery according to the invention will now be described with reference to the drawings. FIGS. 1 and 2 are explanatory diagrams showing an example of the integrated type solar battery of the invention. In the diagrams, a plurality of solar batteries 105 and 106 are serially connected. An upper electrode 103 of one (105) of the adjacent solar batteries 105 and 106 is connected to a lower electrode 111 of the other solar battery 106 by a lead wire 110. A groove portion 107 of a boundary of the adjacent solar batteries is filled with an insulative material 108 so as to cover the edge portions of the adjacent solar batteries. A conductive material (collecting electrode) 109 is arranged so as to connect an upper portion of the insulative material 108 and the upper electrode 103 of the solar battery 105. The lead wire 110 is arranged on the insulative material 108 along the groove portion 107 of the boundary so as to connect to the conductive material 109. Edge portions 201 and 202 of the lead wire are connected to exposed portions 203 and 204 of the lower electrode of the other solar battery. Lower electrodes 101 and 111 are formed on conductive solar battery substrates 101' and 111', respectively. Those conductive substrates form parts of the lower electrodes. Reference numeral 104 denotes a supporting member. At least the upper surface of the supporting member 104 has an insulative property.

According to the invention, since the lead wire 110 connecting the adjacent solar batteries 105 and 106 doesn't exist over semiconductor layer 102, electric power is not lost due to the shadow of the lead wire 110 and photoelectric converting efficiency of the integrated type solar battery is improved. Since the groove portion 107 of the boundary is filled with the insulative material 108, concern that portions between the lead wire 110 and the lower electrodes 101 and 111 or portions between the lead wire 110 and the solar batteries 105 and 106 are short-circuited is eliminated and the reliability is improved. The lead wire 110 and the conductive material 109 of the collecting electrode are connected at a position over the insulative material 108 instead of the solar batteries, so that there is no fear of damage to the solar batteries due to the heat which is generated during the connecting operation or the like. In addition, there is no need to connect a lead wire to the back surface and to individually pattern the lower electrodes, semiconductor layer, and upper electrode. The solar battery can be manufactured by simple processing steps. Consequently, the integrated type solar battery can be manufactured at low cost. By properly selecting the thickness of insulative material to fill the groove portion of the boundary, difference in the level of the edge portion of the solar battery between the upper electrode and the upper surface of the insulative material can be reduced. Disconnection of the conductive material 109 can be prevented while keeping the insulation between the lead wire and the edge portion of the solar battery.

Figure 3:
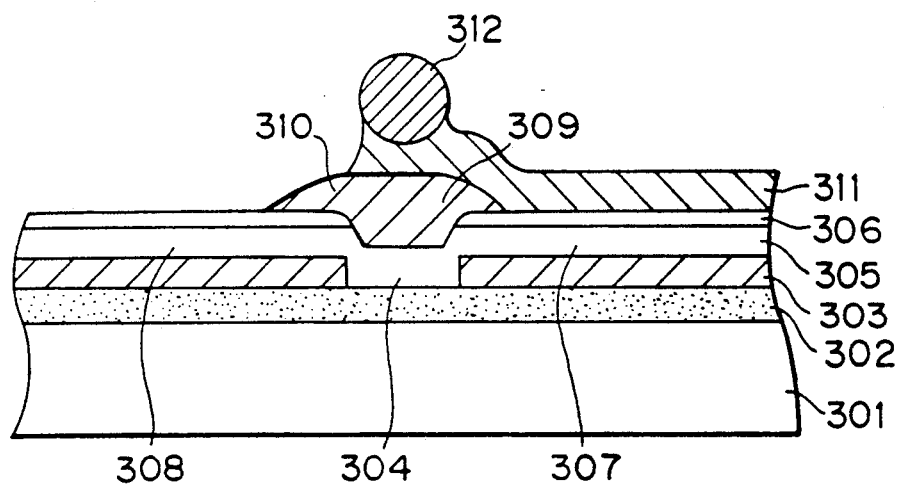
FIG. 3 is a cross sectional view of another example of an integrated type solar battery according to the invention.
Figure 4:
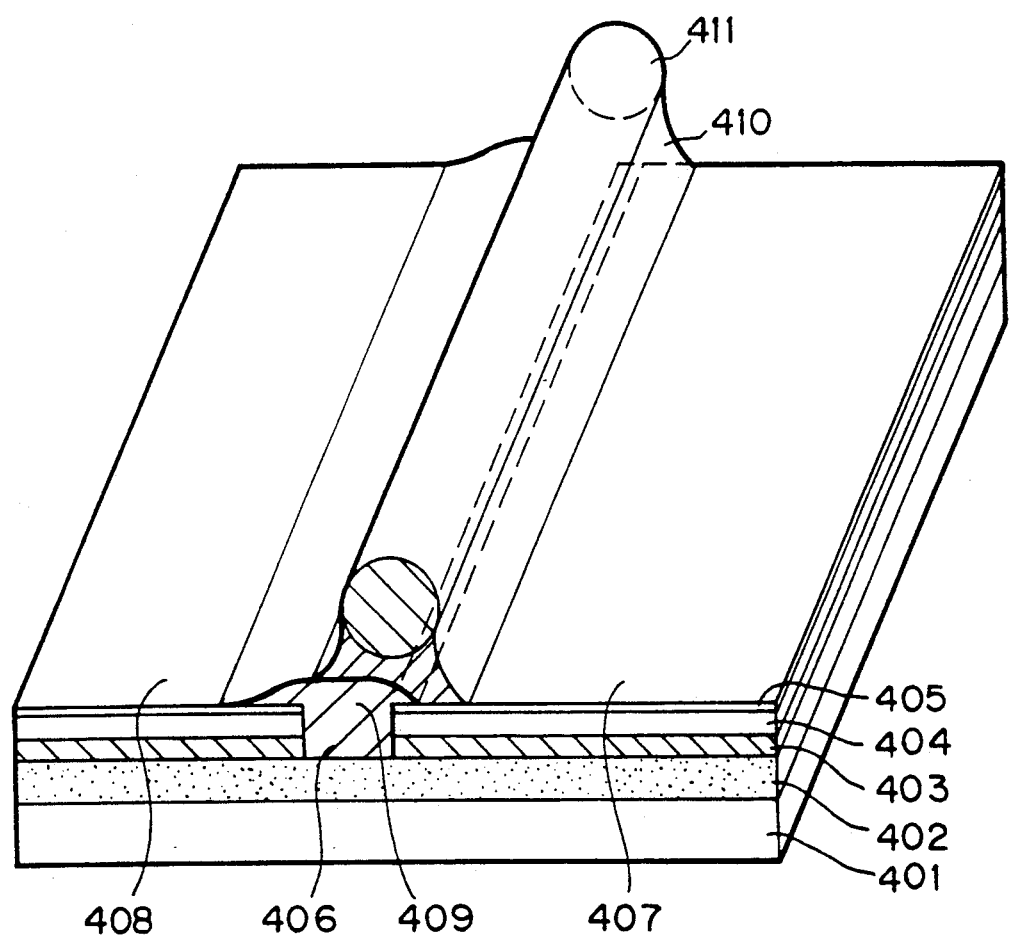
FIG. 4 is an explanatory diagram of a still another example of an integrated type solar battery according to the invention and corresponds to an enlarged diagram of the portion surrounded by a broken line in FIG. 5.

Each section of the construction of the invention will now be described further in detail hereinbelow. As an integrated type solar battery of the invention, it is possible to use a solar battery of the type in which solar batteries whose substrates 101' and 111' are also divided are serially connected as shown in FIG. 1 or a solar battery of the type in which a solar battery formed on a common substrate is divided into a plurality of portions and these portions are serially connected as shown in FIGS. 3 and 4. In the case of dividing the solar battery formed on a common substrate 301 into a plurality of portions, at least the lower electrode 303 and the upper electrode 306 must be separated. However, semiconductor layer 305 is not necessarily separated so long as a conductivity in the lateral direction is low enough.

In the case of dividing the substrate, a usual material can be used as substrate material of the integrated type solar battery of the invention. However, in the case of using a common substrate, an insulative substrate, or a substrate which is formed by coating an insulative layer on a conductive substrate is used. As an insulative substrate, an inorganic insulative material such as alkali-free glass or the like can be also used or a heat resistant synthetic resin such as polyimide, polyethylene terephthalate, or the like can be also used. A metal such as stainless steel, Al, Fe, etc. can be used as a conductive substrate. As an insulative layer which is coated onto the conductive substrate, a thin film of an inorganic material such as $SiO_2$, $Si_3N_4$, $Al_2O_3$, etc. is formed or the above-mentioned synthetic resin may be also coated.

As a semiconductor layer to generate a photo electromotive force in the invention, there is preferably used an amorphous semiconductor such as amorphous silicon (hereinafter, abbreviated to a-Si), amorphous silicon alloy, or the like, polycrystalline silicon, monocrystalline silicon, a semiconductor of the II–VI elements such as CdS, CdTe, or the like, or a semiconductor such as $CuInSe_2$ or the like. The semiconductor layer is valence electron controlled to be a p type or a n type and a pn junction, a pin junction, pin/pin double cells, triple cells, or the like is formed.

In the invention, the upper electrode is formed on the solar light incident side of the semiconductor layer. Therefore, a transparent conductive film having a high transmittance of solar light, such as ITO, $In_2O_3$, $SnO_2$, $TiO_2$, ZnO, etc. is preferably used.

In the invention, the lower electrode is formed on the side opposite to the light incident side of the semiconductor layer. A metal such as Al, Ag, Cr, Ni, Au, Pb, Sn, Zn, Mg, Cu, Fe, W, Mo, etc. or an alloy such as a stainless steel or the like is preferably used as the lower electrode. When a conductive substrate is used, the substrate can also function as a lower electrode. It is also possible to construct a lower electrode of two or more layers by forming a conductive film of ZnO or the like between such a lower electrode material and the semiconductor layer.

In the invention, as an insulative material to fill the groove portion of the boundary of the adjacent solar batteries, an inorganic insulative material such $SiO_2$, $Si_3N_4$, $Al_2O_3$, or the like may be used. Or one of the various synthetic resins such as epoxy, polyamide, polyester, silicone, and the like can also be used. In the invention, the insulative material covers the edge portions of the adjacent solar batteries. When the thickness of insulative material is too thin, there is concern that the portion between the lead wire or the conductive material and the edge portions of the solar batteries is short-circuited. When the thickness is too thick, a difference in level between the insulative material and the upper electrode of the solar battery is large, so that there is concern that the conductive material which connects the lead wire and the upper electrode is disconnected. Therefore, it is desirable to form the insulative material having a thickness within a range from 0.2 μm to 1 mm, measured from the upper surface of the upper electrode. More preferably, it is desirable to set the thickness within a range from 0.5 μm to 0.5 mm, optimally, 1 μm to 100 μm.

In the invention, as a conductive material connecting the lead wire and the upper electrode, it is possible to use a conductive resin containing a metal such as Al, Ag, Cr, Ni, Au, Pb, Sn, Zn, Mq, Cu, Fe, W, Mo, etc., an alloy such as a solder or the like, or a powdered metal such as an Ag paste or the like. The conductive material can be in a comb shape as shown in FIG. 2. In this case, a material having a resistance lower than that of the upper electrode is used as a conductive material. The conductive material also functions as a collecting electrode of a solar battery. When the width of groove portion 406 of the boundary of the divided portions of the solar batteries which are serially connected is sufficiently narrow and the width of the solar battery between the connecting portions is narrow and loss of electric power due to the resistance of the upper electrode is sufficiently small, it is also possible to arrange the lead wire in parallel with the groove of the boundary as shown in FIG. 4. Suitable values of the thickness of conductive material also differ because the resistance values differ in accordance with the material. However, when the thickness is too thin, there is a fear of disconnection. when it is too thick, the line width must be also made thick and the light receiving area is reduced. Therefore, it is desirable to set the thickness of the conductive material to a value within a range from 0.2 μm to 2 mm, more preferably, 0.5 μm to 1 mm, and optimally, 1 μm to 500 μm.

In the invention, the lead wire is arranged over the insulative material to fill the groove portion of the boundary of the adjacent solar batteries and is connected to the conductive material. One or both edges of the lead wire is/are connected to the lower electrode of the solar battery. Although the conductive material and the lead wire are connected at a position over the insulative material, a conductive resin using an alloy such as a solder or the like or a powdered metal such as an Ag paste or the like is preferably used for such a connection. The lead wire and the lower electrode are connected in the exposed portion of the lower electrode in which the semiconductor layer of the solar battery and the upper electrode are not formed. As a connecting method, a welding method can be used or a conductive resin such as an alloy of a solder or the like or a powdered metal can be used. As a material for the lead wire, it is possible to use a conductive resin containing a metal such as Al, Ag, Cr, Ni, Au, Pb, Sn, Zn, Mg, Cu, Fe, W, Mo, etc., an alloy such as solder a solder or the like, or a powdered metal such as an Ag paste or the like. To reduce the electric power loss, it is desirable to set the resistivity of the lead wire to a value which is equal to or less than 0.1 Ω·cm, more preferably, 0.05 Ω·cm or less, optimally 0.01 Ω·cm or less.

Although the invention has been shown and described with respect to the case of serial connection, it is also possible to use a combination of serial connection of the solar battery elements and parallel connection of the solar battery elements. In this case, for instance, two or more solar batteries shown in FIG. 2 are arranged in a manner such that the same solar battery elements are located just beside the extension line of the solar battery elements and the boundary portion of the solar batteries so arranged is filled with the insulative material and is electrically connected to the solar battery elements so arranged so as to pass over the insulative material through the lead wire.

A manufacturing method of the integrated type solar battery of the invention will now be described.

The solar battery is first divided into a plurality of portions. In the case of dividing the substrates 101', and 101' as shown in FIG. 1, the solar battery is formed up to the upper electrode and, after that, it is cut into desired sizes. It is desirable to eliminate the upper electrode along the cutting line in this instance. The solar batteries can be also formed onto substrates which have been previously cut into desired sizes. In the case of integrating the solar batteries onto the common substrate 301 as shown in FIG. 3, at least the lower electrode 303 and the upper electrode 306 among the lower electrode 303, semiconductor layer 305, and upper electrode 306 are linearly removed and the solar battery is divided into a plurality of solar batteries. When the semiconductor layer 305 has a high resistance and the leakage current between adjacent solar batteries 307 and 308 can be ignored, it is not always necessary to remove the semiconductor layer 305 in the boundary portion 304.

As a method of linearly removing the lower electrode 303, upper electrode 306, and semiconductor layer 305, it is possible to use a method of linearly etching by using a mask, a method wherein an etching paste is linearly coated and etching is performed, and a method of linearly removing the layers by irradiating an energy beam such as a laser beam, electron beam, or the like. Or, it is also possible to use a method wherein portions to be removed are masked and a film is then formed such that no film is formed at the portions to be removed.

A groove portion 309 of the boundary of the solar batteries which have been divided or cut into a plurality of portions is filled with an insulative material 310. In this instance, as an insulative material 310, a paste-like insulative material is coated by a dispenser or the like and is hardened, or a masked deposition is performed by a CVD method or the like, or after an insulative layer is formed onto the whole surface, the portions other than the groove portion 309 are eliminated by etching.

After that, as shown in FIG. 1, the upper electrode 103 of one solar battery 105 and the upper portion of the insulative material when they are seen form the groove portion of the boundary are connected by the conductive material 109. At this time, it is preferable that the conductive material be formed into a desired pattern by a screen printing or the like or is formed by vapor depositing a metal or the like into a desired pattern by using a mask or, after a conductive film is formed on the whole surface, it is etched into a desired pattern.

After, that, the lead wire 110 is arranged over the insulative material 108 to fill the groove portion 107 of the boundary of the solar battery and is connected to the conductive material 109 by using a conductive resin such as an Ag paste or the like or an alloy such as a solder or the like at a position over the insulative material. As shown in FIG. 2, one or both of the edge portions 201 and 202 of the lead wire 110 are connected to the lower electrodes 203 and 204 of the other solar battery. When connecting the edge portions 201 and 202 to the lower electrodes, in the exposed portions 203 and 204 of the lower electrodes in which the semiconductor layer and the upper electrode are not formed or were removed, the lead wire 201 and the lower electrodes are connected by using a conductive resin such as an Ag paste or the like or an alloy such as a solder or the like or by welding.

The adjacent solar batteries are serially connected by the above processing steps. After that, a surface protective layer, terminals to output electric power, and the like are formed, thereby completing an integrated type solar battery module.

Embodiment 1

An integrated type solar battery of the invention of FIGS. 1 and 2 in which the solar battery substrate is cut is manufactured by the following processing steps.

A strip-shaped SUS substrate 101', having a thickness of 0.15 mm, a width of 32 cm, and a length of 300 m is cleaned and each layer is formed therein by a roll-to-roll method. First, an alloy of Al and Si having a thickness of 2000 Å is vacuum deposited by an RF sputtering method, a ZnO film having a thickness of 700 Å is vapor deposited, and the lower electrode 101 is formed.

An n type a-Si layer having a thickness of 200 Å, an i type a-Si layer having a thickness of 4500 Å, a p type microcrystalline Si layer (hereinafter, abbreviated to a $\mu$c-Si layer) having a thickness of 80 Å are deposited by a plasma CVD method. An n type a-Si layer having a thickness of 180 Å, an i type a-Si layer having a thickness of 1000 Å, and a p type $\mu$c-Si layer having a thickness of 50 Å are deposited on them, thereby forming a semiconductor layer 102 of pin/pin structure.

An ITO film having a thickness of 700 Å is vapor deposited by a resistance heating method and the transparent upper electrode 103 is formed, thereby forming a two-cell tandem stacked type solar battery.

After that, an etching paste is linearly coated and the upper electrode 103 is linearly etched. The pin/pin stack is cut into desired sizes along the etch lines down to the substrate 101'.

A plurality of thus defined solar batteries are fixed onto the supporting member 104 of SUS whose surface is coated with EVA as shown in FIG. 1.

After that, the groove portion 107 of the boundary of the adjacent solar batteries 105 and 106 is filled with the insulative material 108. As an insulative material, an epoxy resin is used and is linearly coated by a dispenser and is hardened. In this instance, the insulative material is coated so as to be higher than the upper surface of the upper electrode 103 by up to 30 $\mu$m, thereby coating the edge portions of the solar batteries 105 and 106.

The conductive material 109 is formed by screen printing using an Ag paste so as to connect the upper portion of the insulative material 108 and the upper electrode 103 of one solar battery 105. The conductive material 109 also functions as a collecting electrode of the solar battery.

The lead wire 110 is fixed over the insulative material 108 along the groove portion 107 of the boundary and is connected to the conductive material 109 by the Ag paste. As shown in FIG. 2, both edge portion 201 and 202 of the lead wire 110 are connected to the exposed portions 203 and 203 of the lower electrode of the other solar battery by spot welding. As a lead wire 110, a Cu line having a rectangular cross sectional shape as shown in FIG. 1 is used.

A plurality of solar batteries are serially connected as mentioned above. Lastly, a surface protective layer is formed from EVA and Tedlar i.e., a trade name of Du Pont for (polyvinyl fluoride) and electric power output terminals are attached, thereby completing an integrated type solar battery module.

The photoelectric converting efficiency of an integrated type solar battery module having a size of 30 cm×40 cm constructed by serially connecting twelve solar batteries was measured by a solar simulator of 100 nW/cm$^2$ and AM (Air Mass) 1.5. AM 1.5 corresponds to a sunlight of incident angle 48°. The module converting efficiency was 8.1%

Embodiment 2

The integrated type solar battery of the invention shown in FIG. 3, in which solar batteries which have been divided into a plurality of portions are serially connected on a common substrate is manufactured by the following processing steps.

Each layer is formed onto a strip-shaped SUS substrate 301 similar to that of the embodiment I by the roll-to-roll method. An SiO$_2$ film having a thickness of 3 $\mu$m is first deposited by a thermo CVD method, thereby forming the insulative layer 302. Subsequently, a line-shaped mask is used and an Al film having a thickness of 4000 Å and an Ag film having a thickness of 200 Å are sequentially resistance heat-evaporated thereon. A ZnO film having a thickness of 1000 Å is formed by RF sputtering, thereby forming the lower electrode 303, from which the portion 304 is linearly removed.

Subsequently, an n type a-Si layer having a thickness of 200 Å, an i type a-SiGe layer having a thickness of 3000 Å, and a p type $\mu$c-Si layer having a thickness of 80 Å are deposited by the plasma CVD method. Further, an n type a-Si layer having a thickness of 180 Å, an i type a-Si layer having a thickness of 2000 Å, and a p type $\mu$c-Si layer having a thickness of 50 Å are deposited on them, thereby forming the semiconductor layer 305 of pin/pin structure.

An ITO film having a thickness of 700 Å is subsequently evaporation deposited by the resistance heating evaporation method and the transparent upper electrode 306 if formed, thereby forming a two-cell tandem stacked type solar battery.

After that, an etching paste is coated onto the upper portion of the line-shaped portion 304 which is not coated with the lower electrode and the ITO film in this portion is eliminated, thereby dividing the laminated stack into a plurality of solar batteries.

Although the semiconductor layer 305 of the divided solar batteries 307 and 308 is continuous, since the semiconductor layer 305 has a sufficiently higher resistance than that of the upper electrode or the lower electrode, leakage current between the solar batteries 307 and 308 is at a level which can be ignored.

In a manner similar to the embodiment 1, the groove portion 309 of the boundary of the solar batteries 307 and 308 is coated with polyester and filled with the insulative material 310. The upper portion of the insulative material and the upper electrode 306 of the solar battery 307 are connected by the conductive material 311. In the embodiment 1, however, since the solar battery is divided while including the substrates 101' and 111', the depth of groove portion 107 of the boundary is set at 0.15 mm, which is almost equal to a thickness of substrate. In the embodiment 2, the depth of groove portion 309 of the boundary is merely about 0.6 $\mu$m, in which the film thickness of the lower electrode 303 and upper electrode 306 are added. Consequently, the thickness of insulative material needed to fill the groove is also thin. In a manner similar to that in the embodiment 1, the height of the boundary portion is higher than the upper surface of the upper electrode 306 by up to 30 μm. The conductive material 311 has a comb-like shape in a manner similar to the embodiment 1 and also functions as a collecting electrode.

A lead wire 312 is fixed onto the insulative material 310 along the groove portion 309 of the boundary of the solar battery and is connected to conductive material 311 by an Ag paste. In a manner similar to FIG. 2, both edge portions 201 and 202 of the lead wire 312 are connected to the exposed portions 203 and 204 of the lower electrode of the other solar battery by soldering. A Cu wire having a circular cross section as shown in FIG. 3 is used as a lead wire.

By the above processing steps, the solar batteries divided into a plurality of portions are serially connected on the common substrate and a surface protective layer and electric power output terminals are formed in a manner similar to embodiment 1, thereby completing an integrated type solar battery.

The photoelectric converting efficiency of the integrated type solar battery module of a size of 30 cm×40 cm constructed by serially connecting fourteen solar batteries was measured by a solar simulator of 100 mW/cm$^2$ of AM 1.5, and the module efficiency was equal to 9.3%.

Embodiment 3

An integrated type solar battery of the invention as shown in FIG. 4 in which solar batteries which have been divided into a plurality of portions are serially connected on a common substrate is manufactured by the following processing steps.

Each layer is formed onto a strip-shaped SUS substrate 401 by the roll-to-roll method in a manner similar to the embodiments 1 and 2.

A Si$_3$N$_4$ film having a thickness of 3 μm is first deposited by a thermal CVD method, thereby forming an insulative layer 402.

An Mo film having a thickness of 1 μm is subsequently vapor deposited as a lower electrode 403 by an electron beam. A CuInSe$_2$ film having a thickness of 2 μm is vapor deposited and then heated. A CdS film having a thickness of 500 Å is subsequently vapor deposited and heated, thereby forming a semiconductor layer 404 having an n-CdS/p-type CIS (CUInSe$_2$) structure.

A ZnO film having a thickness of 1 μm is formed by RF sputtering, thereby forming a transparent upper electrode 405.

A Q switch pulsed laser beam having a diameter of 50 μm is irradiated from a YAG laser having a wavelength of 1.06 μm is then scanned, thereby removing the lower electrode, semiconductor layer, and upper electrode of the portion 406 and dividing the solar battery formed on the integrated substrate into a plurality of portions 407 and 408.

In a manner similar to the embodiment 1 and 2, the groove portion 406 of the boundary of the solar batteries 407 and 408 is coated with polyamide and filled with an insulative material 409. In this instance, the thickness of insulative material 409 from the upper surface of the upper electrode 405 is up to about 25 μm.

An Ag paste is coated in a shape as shown in FIG. 4 by screen printing so as to connect the upper portion of the insulative material 409 and the edge portion of one solar battery 407, thereby forming a conductive material 410.

Figure 5:
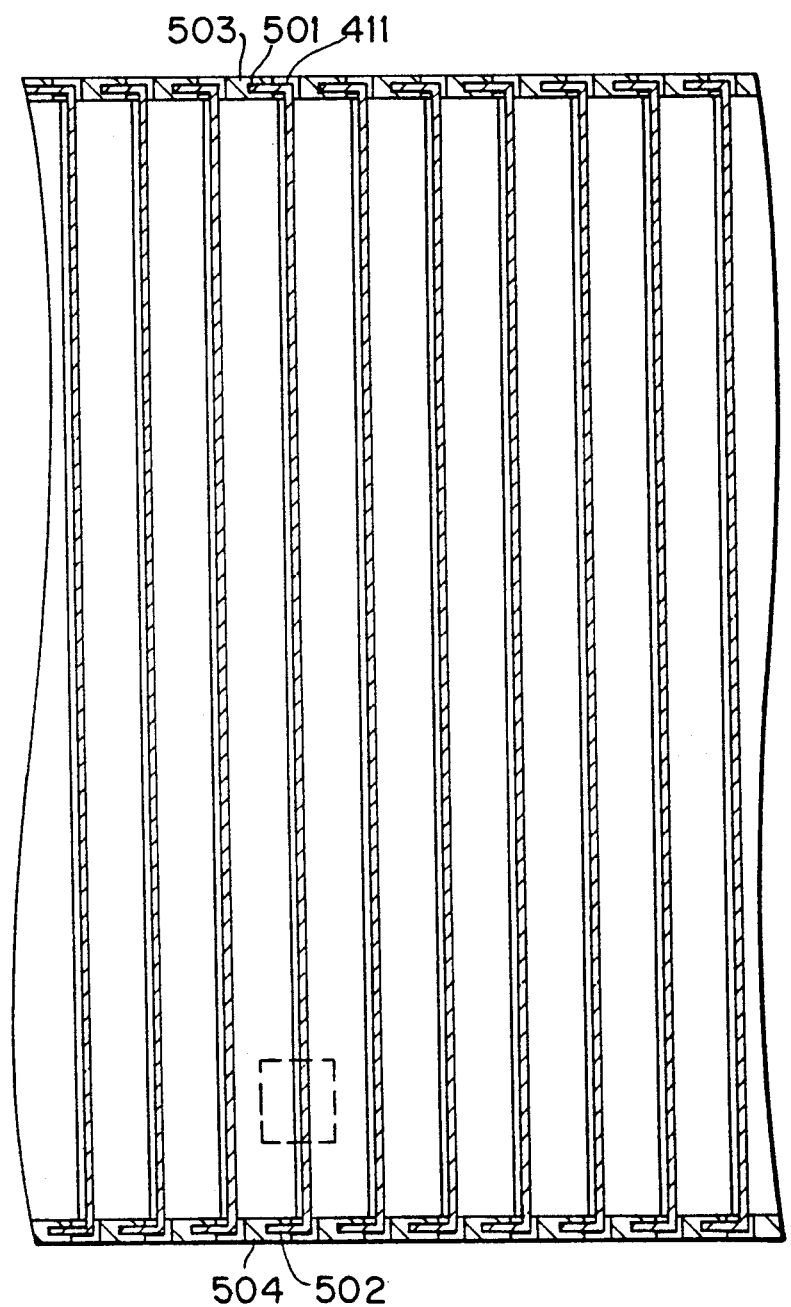
FIG. 5 is an external view of still another example of an integrated type solar battery according to the invention.
Figure 6:
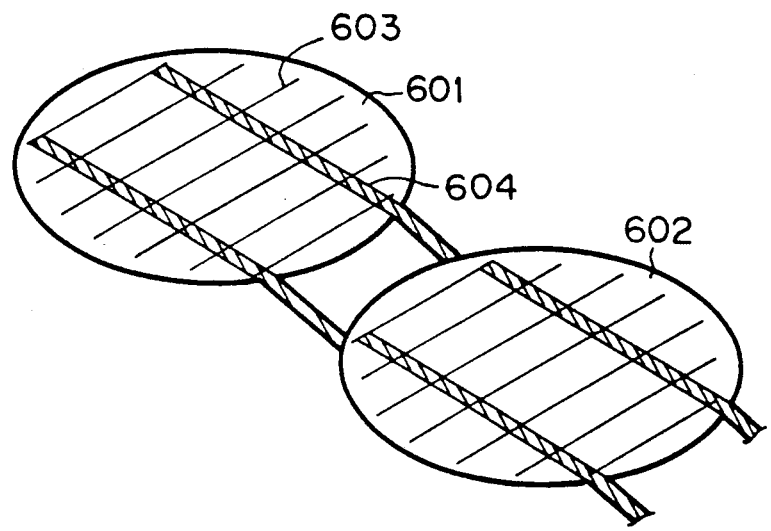
FIG. 6 is an explanatory diagram of a conventional integrated type solar battery.
Figure 7:
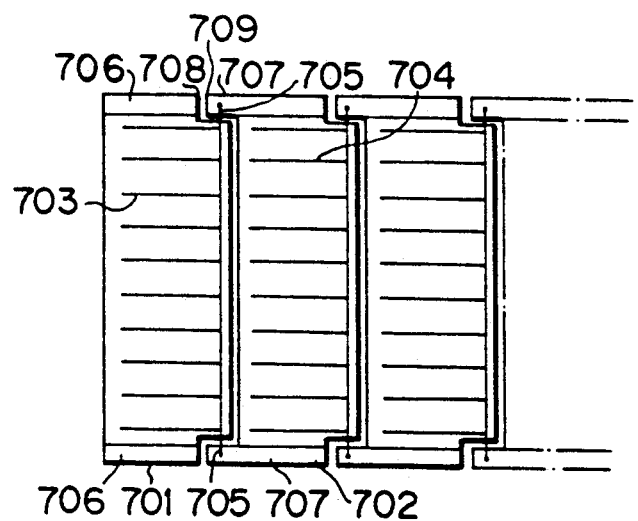
FIG. 7 is an explanatory diagram showing another example of an conventional integrated type solar battery.
Figure 8:
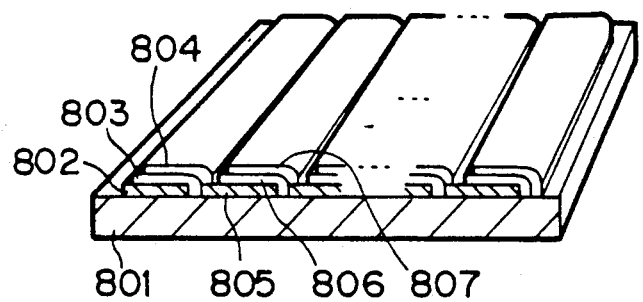
FIG. 8 is an explanatory diagram showing further another example of a conventional integrated type solar battery.

After that, over the insulative material 409, a lead wire 411 of Cu having a circular cross section is adhered to the conductive material 410 along the groove portion 406 by an Ag paste and is fixed as shown in FIG. 4. As shown in FIG. 5, in exposed portions 503 and 504 of the lower electrode in which the semiconductor layer and upper electrode of the other solar battery 408 are not formed, both edge portions 501 and 502 of the lead wire 411 are connected to the lower electrode by soldering.

By the above processing steps, the solar batteries divided into a plurality of portions are serially connected on the common substrate. In a manner similar to the embodiments 1 and 2, a surface protective layer and electric power output terminals are formed, thereby completing an integrated type solar battery.

The photoelectric converting efficiency of an integrated type solar battery module having a size of 30 cm×40 cm constructed by serially connecting 35 solar batteries was measured by a solar simulator of 100 mW/cm$^2$ of AM 1.5, and the module efficiency was equal to 8.9%.

Embodiment 4

An integrated type solar battery of the invention of which solar batteries divided into a plurality of portions are serially connected on a common substrate was manufactured by the following processing steps.

Each layer is formed onto a strip-shaped polyethylene terephthalate substrate having a width of 32 cm, a thickness of 0.25 mm, and a length of 100 m by a roll-to-roll method.

An alloy of Al and Si having a thickness of 5000 Å is vapor deposited by a resistance heating method, thereby forming the lower electrode. In this instance, the alloy is vapor deposited by using a linear mask and a linear dividing groove is formed on the lower electrode.

An n type a-Si layer having a thickness of 250 Å, an i type a-Si layer having a thickness of 4000 Å, and a p type μc-Si layer having a thickness of 50 Å are sequentially deposited by a plasma CVD method, thereby forming a pin type semiconductor layer.

Subsequently, an SnO$_2$ film having a thickness of 2000 Å is formed by a DC sputtering method, thereby forming a transparent upper electrode. After that, in a manner similar to embodiment 2, as shown in FIG. 3, the upper electrode over the dividing groove of the lower electrode is removed by etching, thereby dividing the solar battery on the common substrate into a plurality or portions.

In a manner similar to embodiments 1 and 3, the groove portion of the boundary of the solar batteries is coated with a silicone resin and filled with an insulative material. An Ag paste is coated onto the groove portion in a manner similar to embodiment 3. The upper electrode of one solar battery and the upper portion of the insulative material are connected by a conductive material.

After that, in a manner similar to embodiment 3, a lead wire of Al having a rectangular cross section is connected to the conductive material over the insulative material along the groove portion of the boundary by using an Ag paste. Both edges of the lead wire are connected to the exposed portion of the lower electrode of the other solar battery by an Ag paste.

By the above processing steps, solar batteries divided into a plurality of portions on the common substrate of insulative material are serially connected.

In a manner similar to the embodiments 1 to 3, a surface protective layer and electric power output terminals are formed, thereby completing an integrated type solar battery.

The photoelectric converting efficiency of an integrated type solar battery module having a size of 30 cm×40 cm constructed by serially connecting 25 solar batteries was measured by a solar simulator of 100 mW/cm$^2$ of AM 1.5, and the module efficiency was equal to 5.0%.

The following aspects are improved by the integrated type solar battery of the invention characterized in that the groove portion of the boundary of the adjacent solar batteries is filled with insulative material so as to coat the edge portions of the adjacent solar batteries, conductive material is arranged so as to connect the upper portion of the insulative material and the upper electrode of one of the adjacent solar batteries, a lead wire is arranged over the insulative material along the groove portion of the boundary of the adjacent solar batteries so as to be connected to the conductive material, and the edge portions of the lead wire are connected to the lower electrode of the other solar battery.

First, since the lead wire is not located over the semiconductor layer but exists over the boundary line of the solar batteries which is not concerned with power generation, the electric power loss due to the shadow of the lead wire is eliminated and the module efficiency of the integrated type solar battery is improved.

Since the boundary portion of the adjacent solar batteries is filled with the insulative material, concern that the portion between the lead wire and the other solar battery is short-circuited is eliminated, concern that the portion between the adjacent solar batteries is short-circuited is eliminated, and the reliability is improved.

Since the lead wire and the conductive material are connected over the insulative material instead of the solar battery, even when heat is applied by soldering or the like, there is no fear of damage to the solar battery, such as diffusion of the upper electrode, short-circuit with the lower electrode, or damage to the semiconductor layer.

By properly selecting the thickness of the insulative material which fills the groove portion of the boundary, the difference in level between the upper electrode and the upper surface of the insulative material in the edge portion of the solar battery is reduced, and a disconnection of the conductive material can be prevented while keeping the insulation between the lead wire and the solar battery edge portion.

What is claimed is:

1. A device comprising a plurality of serially connected solar cells, each cell comprising a laminate of a first electrode layer, a photovoltaic semiconductor layer provided on said first electrode, and a second electrode layers provided on said photovoltaic semiconductor layer, said device further comprising:
   an insulative member provided at the boundary between each adjacent pair of said solar cells, so as to cover each of the layers of said laminates at both opposed edges of each said adjacent pair of solar cells;
   a first conductive member electrically connected to said second electrode of one of each said adjacent pair of solar cells; and
   a second conductive member positioned on said insulative member and electrically connected to said first conductive member and to said first electrode of the other of each said adjacent pair of solar cells.

2. A device according to claim 1, wherein said solar cells are positioned on a common substrate.

3. A device according to claim 2, wherein said common substrate is an insulative one or is one formed by coating an insulative layer onto a conductive substrate.

4. A device according to claims 1, 2 or 3, wherein said first conductive member is a current collection electrode.

5. A device according to claims 1, 2 or 3 wherein said photovoltaic semiconductor layer is made of an amorphous semiconductor.

6. A device according to claim 4 wherein said photovoltaic semiconductor layer is made of an amorphous semiconductor.

7. A device according to claim 1, wherein sections of insulative member or size 2 μm-1 mm extend over the opposed edges of said second electrodes.

8. A device according to claim 1, wherein said insulative material is made of $SiO_2$, $Si_3N_4$, $Al_2O_3$, epoxy resin, polyamide, polyester, or silicone resin.

9. A device according to claim 1, wherein said second conductive member is a lead wire.

10. A device according to claim 1, wherein said first conductive member is made from a conductive paste.

11. A device according to claim 1, wherein said second electrode is a transparent electrode.

12. A device according to claim 1, wherein said first electrode of the other of the adjacent pair of solar cells is electrically connected to said second conductive member at a non-opposed edge thereof of said one of said adjacent pair of solar cells.

* * * * *

UNITED STATES PATENT AND TRADEMARK OFFICE
CERTIFICATE OF CORRECTION

PATENT NO. : 5,259,891

DATED : November 9, 1993

INVENTOR(S) : JINSHO MATSUYAMA, ET AL.

Page 1 of 2

It is certified that error appears in the above-identified patent and that said Letters Patent is hereby corrected as shown below:

COLUMN 2

Line 50, "cross sectional" should read --cross-sectional--.

COLUMN 4

Line 25, "photo electro-" should read --photo-electro- --.
  Line 35, "is" should read --are--.

COLUMN 5

Line 8, "AI," should read --Al,--.
  Line 9, "Mq," should read --Mg,--.
  Line 52, "AI," should read --Al,--.
  Line 53, "solder a solder" should read --a solder--.

COLUMN 6

Line 8, "101'" should read --111'--.

COLUMN 7

Line 61, "cross sectional" should read --cross-sectional--.

COLUMN 8

Line 5, "nW/cm$^2$" should read --mW/cm$^2$--.
  Line 38, "if" should read --is--.

UNITED STATES PATENT AND TRADEMARK OFFICE
CERTIFICATE OF CORRECTION

PATENT NO. : 5,259,891

DATED : November 9, 1993

INVENTOR(S) : JINSHO MATSUYAMA, ET AL.

It is certified that error appears in the above-identified patent and that said Letters Patent is hereby corrected as shown below:

<u>COLUMN 12</u>

Line 5, "layers" should read --layer--.
Line 35, "insulative" should read --said insulative-- and "or" should read --of--.
Line 39, "said insulative material" should read --said insulative member--.
Line 40, "$_2$O3," should read --$_2O_3$,--.

Signed and Sealed this

Twenty-sixth Day of July, 1994

Attest:

BRUCE LEHMAN

Attesting Officer   Commissioner of Patents and Trademarks